United States Patent
Fjelstad

(10) Patent No.: US 8,510,935 B2
(45) Date of Patent: Aug. 20, 2013

(54) ELECTRONIC ASSEMBLIES WITHOUT SOLDER AND METHODS FOR THEIR MANUFACTURE

(75) Inventor: Joseph C. Fjelstad, Maple Valley, WA (US)

(73) Assignee: Joseph C Fjelstad, Maple Valley, WA (US)

( * ) Notice: Subject to any disclaimer, the term of this patent is extended or adjusted under 35 U.S.C. 154(b) by 869 days.

(21) Appl. No.: 12/170,426

(22) Filed: Jul. 9, 2008

(65) Prior Publication Data

US 2009/0017264 A1    Jan. 15, 2009

Related U.S. Application Data

(60) Provisional application No. 60/959,148, filed on Jul. 10, 2007, provisional application No. 60/962,627, filed on Jul. 31, 2007.

(51) Int. Cl.
*B32B 3/10* (2006.01)

(52) U.S. Cl.
USPC ............................ 29/832; 29/841; 29/854

(58) Field of Classification Search
USPC ............. 361/250, 254, 260, 760; 29/825, 29/828, 832, 841, 842, 846, 850, 854, 855; 174/260–262; 257/666–677, 780, 783, 784
See application file for complete search history.

(56) References Cited

U.S. PATENT DOCUMENTS

| | | | | |
|---|---|---|---|---|
| 2,916,805 A * | 12/1959 | Plesser | ............................ | 29/837 |
| 4,635,356 A | 1/1987 | Ohuchi | | |
| 5,225,966 A * | 7/1993 | Basavanhally et al. | ........ | 361/774 |
| 5,340,640 A * | 8/1994 | Bientz | ............................ | 428/206 |
| 5,428,190 A * | 6/1995 | Stopperan | ..................... | 174/261 |
| 5,637,176 A * | 6/1997 | Gilleo et al. | ................... | 156/277 |
| 5,734,555 A | 3/1998 | McMahon | | |
| 5,877,545 A * | 3/1999 | Prince et al. | .................... | 257/679 |
| 5,958,590 A * | 9/1999 | Kang et al. | ..................... | 428/403 |
| 6,147,311 A * | 11/2000 | Higashi | ......................... | 174/261 |
| 6,160,714 A | 12/2000 | Green | | |
| 6,331,679 B1 * | 12/2001 | Higashi | ......................... | 174/260 |
| 6,544,428 B1 * | 4/2003 | Higashi | .......................... | 216/13 |
| 6,592,783 B2 * | 7/2003 | Kumakura et al. | ........... | 252/500 |
| 6,774,314 B2 * | 8/2004 | Toyoshima et al. | ........... | 174/260 |
| 6,782,615 B2 * | 8/2004 | Shibata et al. | ................... | 29/846 |
| 6,833,993 B2 * | 12/2004 | Wang | ............................ | 361/704 |
| 6,853,086 B1 * | 2/2005 | Nakayama | ..................... | 257/778 |
| 6,919,508 B2 * | 7/2005 | Forcier | .......................... | 174/565 |
| 7,011,988 B2 * | 3/2006 | Forcier | .......................... | 438/108 |
| 7,134,879 B2 * | 11/2006 | Sugimoto et al. | ............... | 439/66 |

(Continued)

OTHER PUBLICATIONS

EP Application No. 08756454.8, European Search Report dated Mar. 21, 2012.

*Primary Examiner* — Boris L. Chervinsky
*Assistant Examiner* — Pete Lee
(74) *Attorney, Agent, or Firm* — Edward P Heller, III

(57) ABSTRACT

A method for producing an assembly of electronic components and assemblies in accord with this, wherein the electronic components have component terminals. A conductive firmament having a first side and a second side is provided. Then the component terminals are connected to the first side of the firmament with an anisotropic conductor. A pattern is applied to the second side of said firmament. And portions of the firmament are removed based on the pattern, such that remaining portions of said firmament form the electrical circuit interconnecting the component terminals.

5 Claims, 4 Drawing Sheets

(56) References Cited

U.S. PATENT DOCUMENTS

| | | | |
|---|---|---|---|
| 7,159,313 B2 * | 1/2007 | Sathe et al. | 29/846 |
| 2003/0057544 A1 | 3/2003 | Nathan | |
| 2004/0244906 A1 * | 12/2004 | Chuang et al. | 156/276 |
| 2005/0091844 A1 * | 5/2005 | Sathe et al. | 29/832 |
| 2005/0237747 A1 * | 10/2005 | Shimizu et al. | 362/294 |
| 2007/0035015 A1 | 2/2007 | Hsu | |
| 2007/0102803 A1 | 5/2007 | Gann | |
| 2009/0133900 A1 * | 5/2009 | Nishikawa et al. | 174/250 |

\* cited by examiner

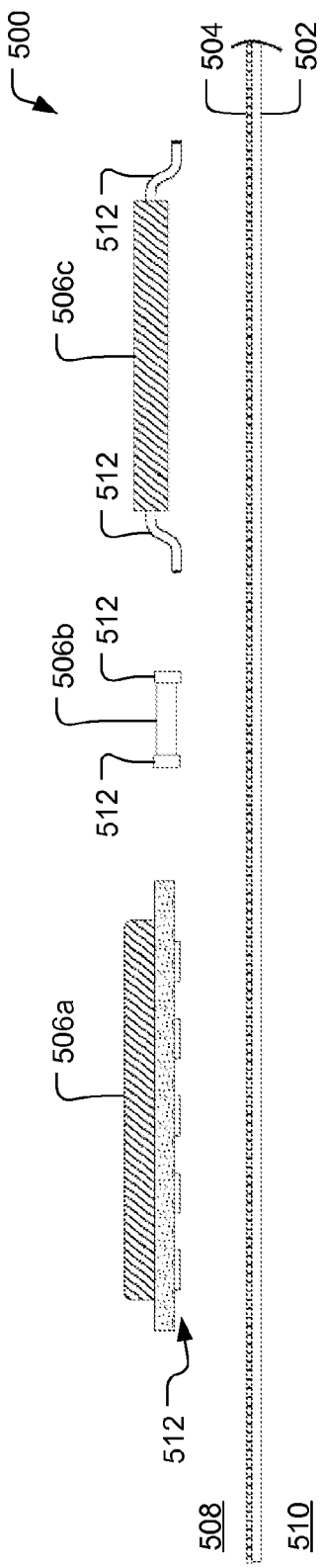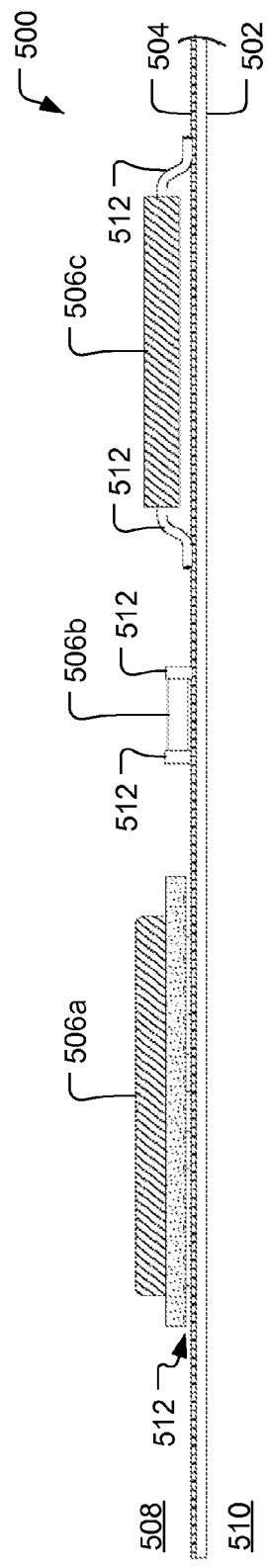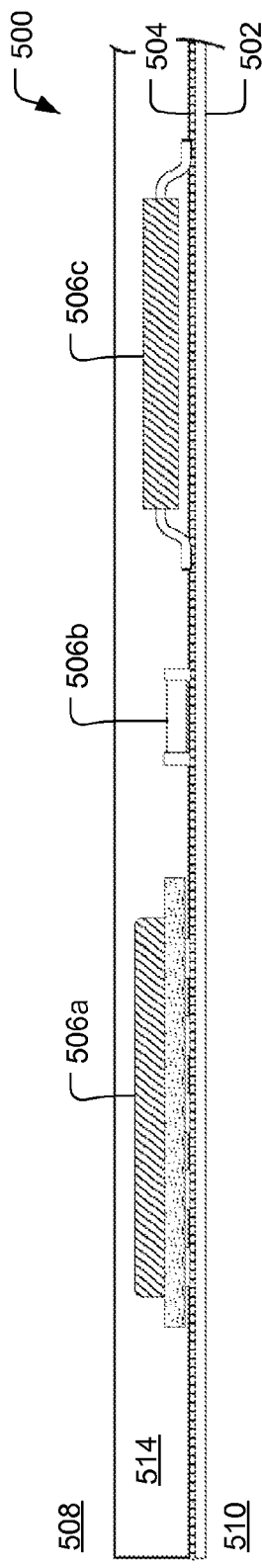

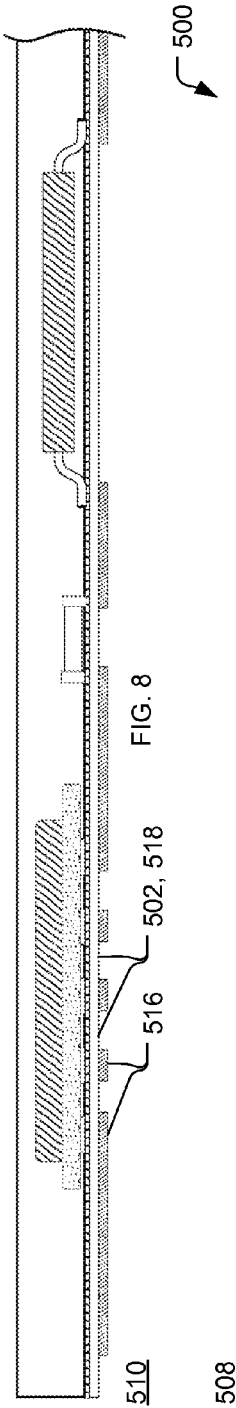
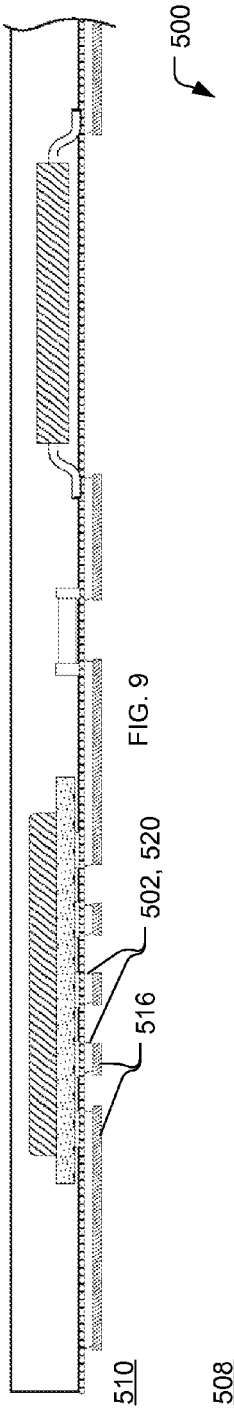
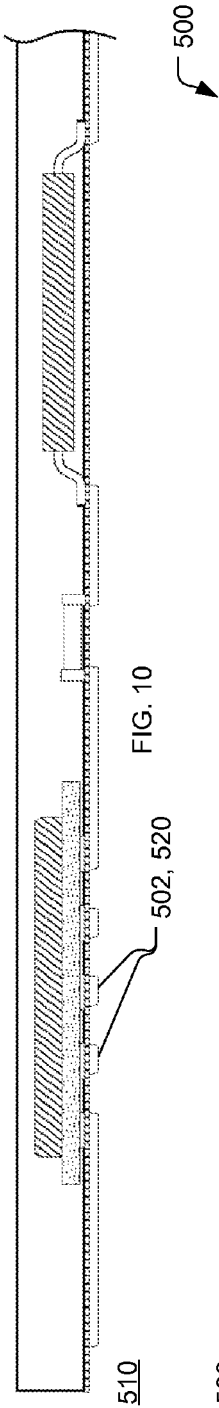
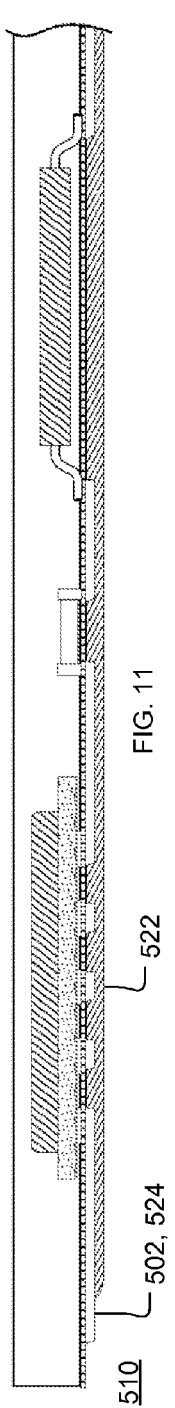

ELECTRONIC ASSEMBLIES WITHOUT SOLDER AND METHODS FOR THEIR MANUFACTURE

CROSS-REFERENCE TO RELATED APPLICATIONS

This application claims the benefit of U.S. Provisional Application No. 60/959,148, filed on Jul. 10, 2007 and U.S. Provisional Application No. 60/962,627, filed on Jul. 31, 2007, hereby incorporated by reference in their entirety.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC

Not applicable.

COPYRIGHT NOTICE AND PERMISSION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Technical Field

The present invention relates generally to the field of electronic assembly and more specifically, but not exclusively, to the manufacture and assembly of electronic products without the use of solder.

2. Background Art

Historically, most electronic products have been assembled using a solder material and a soldering process. This has always had certain disadvantages, and a number of new trends are revealing or exacerbating other disadvantages.

One set of disadvantages relates to solder materials themselves. Since the earliest days of the electronics industry tin/lead type solders (e.g., Sn63/Pb37) have been widely used. Unfortunately, both tin and especially lead have serious chemical disadvantages. For these two metals, mining the ores, refining it, working with the refined metals during manufacturing, being exposed to the substances in manufactured products, and disposing of the products at the ends of their life cycles are all potentially damaging to human health and to the environment.

Recently human health and environmental concerns about tin/lead type solders have resulted in the Directive on the Restriction of the Use of Certain Hazardous Substances in Electrical and Electronic Equipment (commonly referred to as the Restriction of Hazardous Substances Directive or RoHS) in the European Union. This directive restricts the use of six hazardous materials, including lead, in the manufacture of various types of electronic and electrical equipment. This directive is also closely linked with the Waste Electrical and Electronic Equipment Directive (WEEE) 2002/96/EC, which sets collection, recycling, and recovery targets for electrical goods. Together these directives are part of a growing worldwide legislative initiative to solve the problem of electronic device waste.

To some extent the electronics industry has always been searching for a practical substitute for tin/lead type solders, and legislative initiatives like those just noted are now motivating a number of changes. Today a common substitute for tin/lead type solders are SAC type solder varieties, which are alloys containing tin (Sn), silver (Ag), and copper (Cu). But this is merely a compromise. Mining, refining, working during manufacturing, exposure from manufactured products, and disposal are still all issues for tin, silver, and copper. It therefore suffices here to say that the undue use of some materials, like solder, is generally undesirable in electronic assemblies.

Another set of disadvantages in the solder-based assembly of electronic products is the high temperature processes that are inherently required. The use of heat on and around many electronic components has always been undesirable. As a general principle, the heating of electronic components increases their failure rate and beyond a certain point outright damages such components. Tin/lead solders melt at relatively low temperatures, and their use has generally been tolerable for many components. This is not as frequently the same for SAC type solders, however, which melt a much higher temperatures (e.g., ~40° C. or greater). When SAC type solders are used the likelihood of component damage is much higher, resulting in assemblies that fail during post-manufacturing testing as well as in-the-field failures. Additionally, generating and managing the heat during manufacturing have energy, safety, and other increased costs. It therefore further suffices here to say that the undue use of head-based manufacturing processes, like soldering, is also generally undesirable in electronic assemblies.

Increasingly yet another set of disadvantages in the solder-based assembly of electronic products is related to the "adding" of materials. When a material, like solder, is added between two components to hold them together the additional material inherently has to occupy some space. The use of liquid-state materials, like solder in its liquid stage, in manufacturing also often requires additional space around leads, terminals, and pads because both product and process designs need to account for the ability of liquid to flow easily and thus to potentially short to other leads, terminals, pads, etc. Liquid surface tension effects are also usually a major consideration in such designs, an liquid solders have high surface tensions. These all thus are factors as designers increasingly strive to miniaturize electronic assemblies. And it therefore yet further suffices here to say that the undue use of additional material in manufactured assemblies and manufacturing processes, again like solder, is generally undesirable in the resulting electronic assemblies. The following figures will help to illustrate some of these points.

FIG. 1 (prior art) is a side cross-section view of a conventional solder-based assembly 100 including a printed circuit board (PCB 102) and a component package 104. The package 104 includes an electrical component 106 having gull wing terminals or leads 108 (one lead 108 shown). A solder joint 110 connects the lead 108 to a terminal pad 112 on the PCB 102. Elsewhere on the PCB 102 insulating material 114 prevents material from the solder joint 110 flowing to where it can short to other solder joints, leads, or terminal pads. In the particular example shown, the PCB 102 is a multi-layer type where a conductor filled through hole 116 connects the terminal pad 112 to one or more conductive traces 118.

This prior art approach has a number of disadvantages. It uses solder, which may contain undesirable materials (e.g., lead) and which requires heat-based manufacturing processes (i.e., soldering). As implied above, solder from the solder joint 110 can flow, thus motivating the use of the insulating material 114 and various additional design concerns to avoid having the solder joint 110 short to other solder joints, leads, or terminal pads. This also complicates both the external structure of PCB 102 as well as the internal structure of the PCB 102. Furthermore, since the solder at the solder joint 100 inherently occupies some space, its presence increases the height of the overall assembly 100.

FIG. 2 (prior art) is a side cross-section view of another conventional solder-based assembly 200 including a printed circuit board (PCB 202) and a different component package 204. The package 204 here includes an electrical component 206, leads 208 (one lead 208 shown), a supports 210, and an insulating base 212. The PCB 202 here includes a terminal pad 214, an insulating material 216, and a through hole 218 connecting the terminal pad 214 to one or more conductive traces 220.

Here a ball of solder 222 connects the lead 208 to the terminal pad 214. But in most respects, particularly including the disadvantages already discussed for the assembly 100, the assembly 200 is largely the same.

FIG. 3 (prior art) is a side cross-section view of a solderless connection apparatus 300 in accord with U.S. Pat. No. 6,160,714 by Green. In this configuration, a substrate 302 supports a component package 304. The package 304 contains an electrical component (not shown) such as an IC or other discrete component. Overlying the substrate 302 is an insulating material 306. On the other side of the substrate 302 is a conductive, polymer-thick-film ink 308. To improve conductivity, a thin film of copper plating 310 is provided on the polymer-thick-film ink 308. A via extends from the package 304 through the substrate 302. The via is filled with a conductive adhesive 314. The point of attachment 316 of the package 304 to the adhesive 314 may be made with fusible polymer-thick-film ink, silver polymer-thick-film conductive ink, or commercial solder paste. One disadvantage of this prior art apparatus 300 is the additional thickness added by the adhesive 314 as illustrated by the bump 318.

BRIEF SUMMARY OF THE INVENTION

Accordingly, it is an object of the present invention to provide improved assemblies of electronic components and methods for their manufacture.

Briefly, one preferred embodiment of the present invention is a method for producing assemblies of electronic components, wherein the electronic components have component terminals. A conductive firmament is provided that has a first side and a second side. The component terminals are then connected to the first side of the firmament with an anisotropic conductor. A pattern is applied to the second side of the firmament. And portions of the firmament are removed based on the pattern such that remaining portions of the firmament form an electrical circuit interconnecting the component terminals of the electronic components.

Briefly, another preferred embodiment of the present invention is an assembly of electronic components, wherein the electronic components have component terminals. A plurality of conductors are provided and an anisotropic conductor is used to connect the component terminals to respective of the plurality of conductors to form an electrical circuit interconnecting the component terminals.

And briefly, another preferred embodiment of the present invention is an improved assembly of electronic components of the type in which the electronic components have component terminals and a plurality of conductors are provided to carry electrical currents between respective of the plurality of conductors. The improvement comprises the use of an anisotropically conductive material to electrically connect the component terminals to the respective of the plurality of conductors to form an electrical circuit interconnecting the component terminals.

An advantage of the present invention is that it avoids the undue and even all use of solder materials in electronic assemblies, and thus of all of the attendant chemical considerations and human safety and environmental damage concerns related to the use of solder materials.

Another advantage of the present invention is that it permits avoiding the use of any higher than ambient temperature-based processes in electronic assemblies, and thus of all of the direct and indirect detrimental effects of high temperature on electronic components and in manufacturing environments.

And another advantage of the present invention is that it permits avoiding adding material, and thus undue dimensional bloat in resulting electronic assemblies made with this invention.

These and other objects and advantages of the present invention will become clear to those skilled in the art in view of the description of the best presently known mode of carrying out the invention and the industrial applicability of the preferred embodiment as described herein and as illustrated in the figures of the drawings.

BRIEF DESCRIPTION OF THE SEVERAL VIEWS OF THE DRAWING(S)

The purposes and advantages of the present invention will be apparent from the following detailed description in conjunction with the appended figures of drawings in which.

Figure 1:
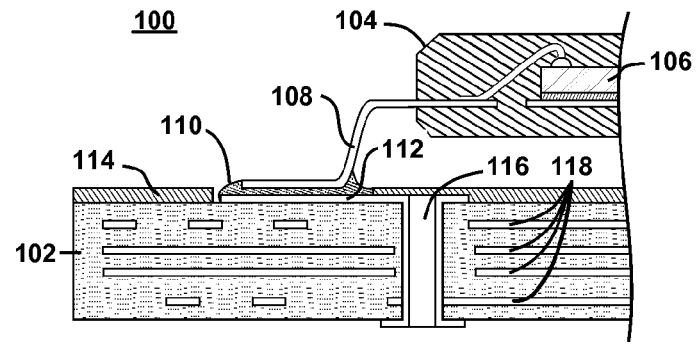
FIG. 1 (prior art) is a side cross-section view of a conventional solder-based assembly including a printed circuit board (PCB) and a component package.
Figure 2:
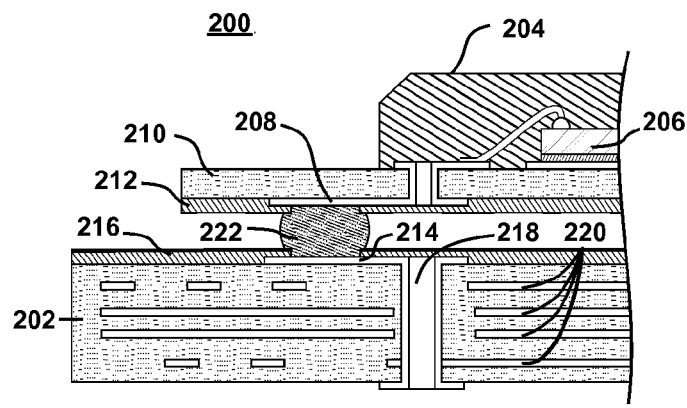
FIG. 2 (prior art) is a side cross-section view of another conventional solder-based assembly including a PCB and a different component package.
Figure 3:
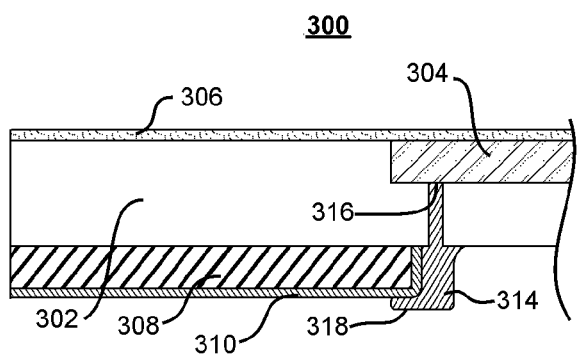

FIG. 3 (prior art) is a side cross-section view of a solderless connection apparatus in accord with U.S. Pat. No. 6,160,714 by Green.

Figure 4:
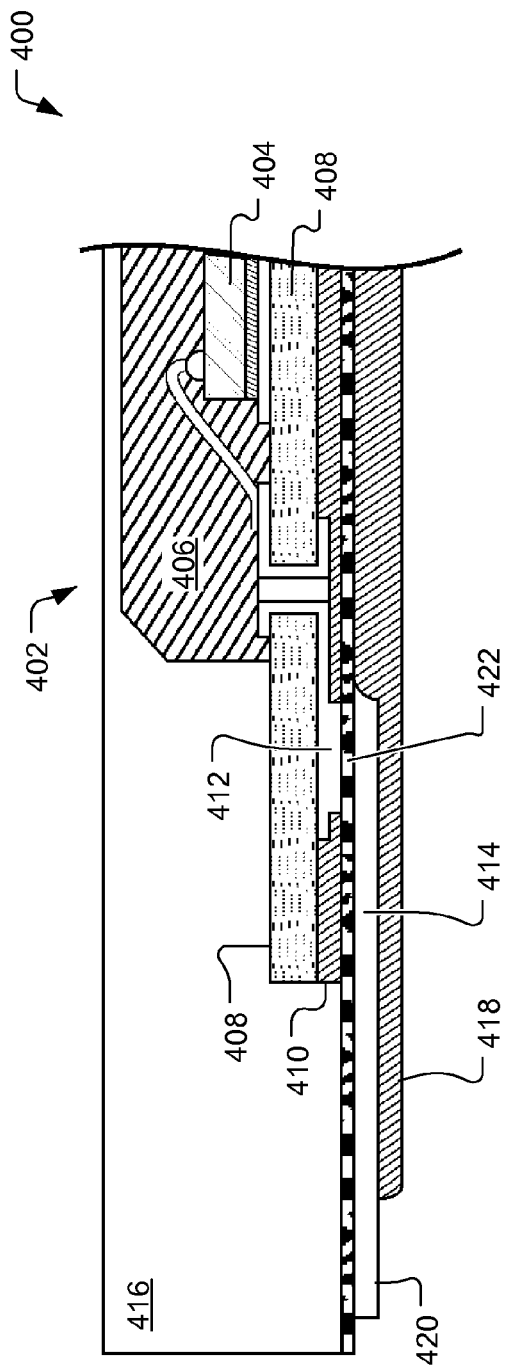
Figure 12:
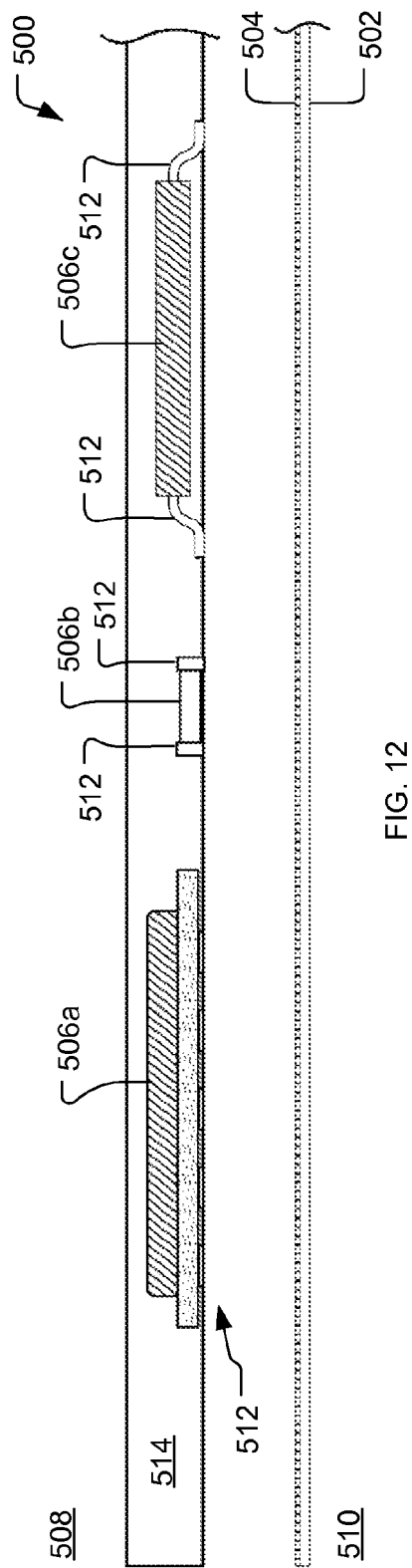

FIG. 4 is a side cross-section view of a portion of an exemplary assembly that is illustrative of the present invention;

FIGS. 5-11 are a series of side cross-section views of an assembly in accord with the present invention that are taken as the assembly proceeds through stages of manufacture; and FIG. 12 is a side cross-section view of an assembly in manufacture wherein the stages depicted in FIGS. 5-6 are altered and the stages depicted in FIGS. 7-11 may or may not be the same.

In the various figures of the drawings, like references are used to denote like or similar elements or steps.

DETAILED DESCRIPTION OF THE INVENTION

A preferred embodiment of the present invention are assemblies of electronic components. As illustrated in the various drawings herein, and particularly in the views of FIGS. 4 and 11, preferred embodiments of the invention are depicted by the general reference characters 400, 500.

FIG. 4 is a side cross-section view of a portion of an exemplary assembly 400 that is illustrative of the present invention. The assembly 400 here includes a land grid array (LGA) type component package 402 that includes an electronic component 404, a housing 406, supports 408, insulating base 410, and leads 412 (one shown). The assembly 400 further includes a circuit of conductors 414 (one conductor 414 shown), a top cover material 416, and a bottom cover material 418. The circuit of conductors 414 has one or more connection points 420 (one connection point 420 shown) and between the leads 412 and the circuit of conductors 414 an anisotropic conductor 422 is provided.

Many of the details of the component package 402 here are not especially relevant. For example, since the component package 402 here is a LGA, the housing 406, supports 408, and base 410 are present. As discussed presently, however, for other types of component packages or simply for other types of electronic components, these may be omitted. It will become apparent from the following discussion that a simple surface mount (SMT) device, a gull wing or other IC package structure, a ball grid array (BGA), or virtually any type of electronic component may be substituted for the LGA shown in FIG. 4. Some key points here are that the electronic component 404 is present and that it has leads 412 that need to be electrically connected into the circuit of conductors 414. It is also of importance that the components used may already be fully tested and burned in prior to use here, to better assure the reliability of the finished assembly 400.

The use of the anisotropic conductor 422 to make the connections between the electrically conductive leads 412 of the electronic component 404 and the electrically conductive conductors 414 of the circuit. The characteristic feature of an anisotropic conductor is that it conducts electrical current in a directionally specific manner, which is here employed to conduct current vertically between the between the lead 412 of the electronic component 404 and the conductor 414 of the circuit yet not also conduct current horizontally to other leads or conductors.

The top cover material 416 and the bottom cover material 418 are both insulating materials and are optional, but will be desirable in many embodiments of assemblies made in accord with the present invention. The top cover material 416 is desirably a tough material (i.e., not brittle) and has coefficient of thermal expansion (CTE) matched to the materials used for the electronic component 404. The top cover material 416 makes the overall assembly 400 more robust. It need not entirely cover the housing 406 of the component package 402, as shown in FIG. 4, and further providing for more or better thermal management. Furthermore, when the top cover material 416 is provided it can permit dispensing with a housing around the electronic component 404, thus reducing the profile of the finished assembly 400. The bottom cover material 418 protects the circuit of conductors 414, which accordingly need not be made larger than necessary to perform its electrical current carrying role. Nonetheless, the bottom cover material 418 can have openings providing access to connection points 420 (if these are desired).

FIGS. 5-11 are a series of side cross-section views of an assembly 500 in accord with the present invention that are taken as the assembly 500 proceeds through stages of manufacture. In FIG. 5 a firmament 502, an anisotropic conductor 504, and a set of electronic components 506*a-c* are provided. The firmament 502 is an electrical conductor, for example, a copper foil or film. The anisotropic conductor 504 here is an anisotropically conductive adhesive that has already been applied to the firmament 502. To facilitate discussion, the assembly 500 is referred to below as having a top side 508 and a bottom side 510.

The electronic components 506*a-c* shown in FIGS. 5-11 are representative examples, and more or less of these or of yet other types of components may be used in different embodiments of the inventive assembly 500. All of the components, including the electronic components 506*a-c* shown here, are characterized by having connections, leads, or terminals (hereinafter terminals 512). The first component 506*a* here is a LGA, for instance, a microprocessor having land type terminals 512. The second component 506*b* is a simple SMT component, such as a resistor having pad type terminals 512. And the third component 506*c* is a more complex SMT component, like a NAND gate IC having gull wing type terminals 512.

In FIG. 6 the terminals 512 of the electronic components 506*a-c* have all been connected to the anisotropic conductor 504 and thus also to the firmament 502. Of course, the electronic components 506*a-c* can all be connected at once or separately at one or more different points in time.

In FIG. 7 an electrically insulating material matrix 514 has been applied to the top side 508 of the assembly 500, thus embedding the electronic components 506*a-c* securely in the matrix 514 and protecting the anisotropic conductor 504 on the top side 508 of the assembly 500. This may be assisted by vacuum or pressure to assure complete filling and the expelling of any potentially entrapped air, thus obviating possible voids.

In FIG. 8 a pattern 516 has been applied to the bottom side 510 of the assembly 500, thus making removal portions 518 of the firmament 502.

In FIG. 9 the removal portions 518 of the firmament 502 are removed, thus leaving remaining portions 520 of the firmament 502 in the assembly 500. Some of the anisotropic conductor 504 that was adjacent to the removal portions 518 of the firmament 502 may coincidentally also be removed but.

In FIG. 10 the pattern 516 has been removed from the remaining portions 520 of the firmament 502.

In FIG. 11 an insulating cover 522 has been added over most of the bottom side 510 of the assembly 500, leaving connection portions 524 (one shown) of the firmament 502 exposed. At this point the inventive assembly 500 is complete. The firmament 502 is now an electrical circuit, internally connecting the terminals 512 of the electronic components 506*a-c* as desired and permitting external connection to this circuit at the connection portions 524.

The series of stages depicted in FIGS. 5-11 can be altered in many respects without deviating from the spirit of the present invention. FIG. 12 is a side cross-section view of an assembly 500 in manufacture wherein the stages depicted in FIGS. 5-6 are altered and the stages depicted in FIGS. 7-11 may or may not be the same.

In FIG. 12 the electronic components 506*a-c* are partially embedded in the electrically insulating matrix 514 before the terminals 512 are brought into contact with the anisotropic conductor 504 on the top side 508 of the assembly 500.

A number of variations on this variation, however, are also possible. For example, in FIG. 12 the anisotropic conductor 504 and the firmament 502 are shown as a subassembly, but this is not a requirement. The electronic components 506*a-c* partially embedded in the matrix 514 can be provided as shown, then the anisotropic conductor 504 can be applied to this, and then the firmament 502 can be added. For that matter, the electronic components 506*a-c* in the matrix 514 can be turned upside down (with respect to what is shown in FIG. 12), the anisotropic conductor 504 can be sprayed or rolled on (say, in the manner of printing ink) and then the firmament 502 can be added. It has previously been noted that the firmament 502 can be a conductive foil or film, but in this variation it can readily be appreciated that the firmament 502 can also be deposited as a conductive layer.

FIGS. 5-12 all show the anisotropic conductor 504 as a complete layer, covering all of one side of the firmament 502. This is also not a requirement. The anisotropic conductor 504 is only needed between the terminals 512 of the electronic components 506a-c and the remaining portions 520 of the firmament 502. It therefore follows that the anisotropic conductor 504 can be applied more sparingly, say by applying it onto the electronic components 506a-c or even just on the terminals 512 of the electronic components 506a-c before they are placed onto the firmament 502. Yet alternately, the anisotropic conductor 504 can be applied as a mask on the firmament 502 and then the electronic components 506a-c, individually or embedded in the matrix 514, can be brought together with the firmament 502.

FIGS. 7 and 12 show the electronic components 506a-c fully enmeshed within the matrix 514, but this also is not necessary. One or more of the electronic components 506a-c can alternately extend above the matrix 514 on the top side 508 of the finished assembly 500. This is useful, for instance, if a component is used to sense light, temperature or some other ambient condition, or if a component emits a signal, e.g., is a light emitting diode (LED) or liquid crystal display (LCD). If desired, the matrix 514 can be made of a transparent material, and fibers can be included in the matrix 514 to strengthen it (and to assist in heat distribution). The matrix 514 is actually optional, but the inventor feels that it will be desirable in many cases. Moreover the matrix 514 may be discontinuous except for interconnections between sections, however, a typical role of the matrix 514 is to make the assembly 500 more robust, and another role can be to cover any anisotropic conductor 504 exposed on the top side 508 of the assembly 500 to prevent dust, moisture, etc. in an operating environment from building up on the anisotropic conductor 504.

In FIGS. 8-9 the pattern 516 is shown as a positive pattern, but this also is not necessary. For example, the pattern 516 in FIGS. 8-9 may be created using conventional photo etching technology, wherein the pattern 516 protects the remaining portions 520 of the firmament 502 as the removal portions 518 of the firmament 502 are removed. Alternately however, the material of the pattern 516 can be such that it removes adjacent portions of the firmament 502, say by being acidic and being only kept in contact with the firmament 502 long enough to dissolve away the removal portions 518. Additionally, various ablation methods (such as by means of a laser) or mechanical methods (such as by means of a router) can be used to define the circuit pattern.

With reference again to FIGS. 9-11, the pattern 516 is removed from the finished assembly 500. But this is also largely optional. In FIG. 11 this permits exposure of the connection portion 524, but that is only one manner that connection to the circuit in the assembly 500 can be accomplished. For instance, one or more terminal blocks can be provided as components which extend above the matrix 514 and out the top side 508 of the assembly 500. Then the insulating cover 522 can simply cover the entire bottom side 510 of the assembly 500, and there may be no reason why the pattern 516 cannot simply be left under the insulating cover 522.

With reference again to FIG. 11, the insulating cover 522 is also optional. In general, however, it is also desirable to prevent dust, moisture, etc. in an operating environment from building up on circuit in the inventive assembly 500.

Summarizing, the inventive assemblies 400, 500 need use no solder, thus bypassing the use of tin, lead, silver, and copper in metallic solder alloys. The inventive assemblies 400, 500 also avoid the problems associated with high temperature manufacturing. Directly this avoids damage to the electronic components 404, 506a-c. Indirectly this permits the use of component units that are already pre-tested and burned in, or the use of such component units and then having to further test and burn-in the end-product assemblies. In this manner re-work and scrapage of finished assemblies due to defects can be markedly reduced. The inventive assemblies 400, 500 also may be dimensionally compact, without space being taken up by solder between components and without added spacing apart between components to accommodate undesirable solder flow characteristics and surface tension related bulge. Furthermore, although single-layer designs have been described above, artisans skilled in the electronic arts should now be able to readily appreciate that additional layers of circuit patterns may be built up using the underlying principles of this invention to construct more complex embodiments of electronic assemblies.

While various embodiments have been described above, it should be understood that they have been presented by way of example only, and that the breadth and scope of the invention should not be limited by any of the above described exemplary embodiments, but should instead be defined only in accordance with the following claims and their equivalents.

What is claimed is:

1. A method for producing a solderless assembly of at least two burned-in or tested electronic components, wherein the at least two burned-in or tested electronic components have component terminals, the method comprising, in order:
  a) providing a conductive firmament having a first side and a second side, wherein said conductive firmament is a conductive layer, or a conductive foil, or a conductive film;
  b) in response to step a), connecting the component terminals of the at least two burned-in or tested components to said first side of said conductive firmament with an anisotropic adhesive, the at least two burned-in or tested electronic components lying entirely on said first side of said conductive firmament with the conductive adhesive being between the components and the conductive firmament;
  c) embedding the at least two electronic components with: a matrix composed of an electrically insulating material; the matrix covering and protecting a first side of the anisotropic adhesive between the at least two burned-in or tested electronic components, the matrix lying entirely on said first side of said conductive firmament;
  d) in response to step c), applying a pattern to said second side of said conductive firmament;
  e) in response to step d), removing portions of said conductive firmament based on said pattern such that remaining portions of said conductive firmament comprises a patterned firmament that forms an electronic circuit interconnecting the component terminals of the at least two burned-in or tested components; and
  f) covering the patterned conductive firmament with an insulating cover, the insulating cover thereby lying entirely on the second side of the conductive firmament, leaving exposed connection portions of the patterned firmament.

2. The method of claim 1, wherein said conductive layer, said conductive foil, or said conductive film consists of a metallic material.

3. The method of claim 1, wherein said anisotropic adhesive is an anisotropically conductive adhesive provided as a layer covering all of said first side of said conductive firmament.

4. The method of claim 1, wherein step d) comprises imaging said pattern onto said second side of said conductive firmament; and step e) comprises etching away portions of said conductive firmament.

5. The method of claim 1, further comprising eliminating all remaining of said pattern from said second side of said conductive firmament.

* * * * *